United States Patent
Lulham

[11] Patent Number: 5,714,885
[45] Date of Patent: Feb. 3, 1998

[54] METHOD AND APPARATUS FOR LOCATING FALUTS IN BURIED CONDUCTORS

[76] Inventor: Don A. Lulham, 452 St. Jacques, Longueuil, Que., Canada, J4H 3C4

[21] Appl. No.: 533,183

[22] Filed: Sep. 25, 1995

[51] Int. Cl.$^6$ ............................................. G01R 31/08
[52] U.S. Cl. ........................... 324/529; 324/327; 324/520; 324/528
[58] Field of Search .............................. 324/529, 528, 324/530, 327, 326, 66, 67

[56] References Cited

U.S. PATENT DOCUMENTS

| | | | |
|---|---|---|---|
| 2,731,598 | 1/1956 | Herbert | 324/529 |
| 3,299,351 | 1/1967 | Williams | |
| 3,526,831 | 9/1970 | Smith | 324/529 |
| 3,792,350 | 2/1974 | Bossler | |
| 3,860,866 | 1/1975 | Domberger | |
| 3,991,363 | 11/1976 | Lathrop | |
| 4,039,938 | 8/1977 | Link | 324/528 |
| 4,438,389 | 3/1984 | De Sa | |
| 5,210,497 | 5/1993 | Regini | |
| 5,352,984 | 10/1994 | Piesinger | 324/528 |

FOREIGN PATENT DOCUMENTS

| | | | |
|---|---|---|---|
| 1172683 | 12/1969 | United Kingdom | 324/528 |
| 2045955 | 11/1980 | United Kingdom | 324/529 |

Primary Examiner—Vinh P. Nguyen
Assistant Examiner—Jose M. Solis
Attorney, Agent, or Firm—Mila Shvartsman

[57] ABSTRACT

Apparatus for detecting faults in buried conductors, a transmitter adapted to transmit electro-magnetic signals down the buried conductor; this signal is provided to increase an electro-magnetic path or corridor existing at the surface above the buried conductor. The invention also relates to a detecting means adapted to detect the electro-magnetic path or corridor, and to detect electro-magnetic patches formed in the path or corridor. These patches are located over the faults, and they are characterized by presence of an increased level of electro-magnetic energy caused by the faults. The transmitter means are adapted to transmit a composite signal comprising a carrier signal transmitted by a carrier signal means and a low frequency signal transmitted by a low frequency means. The carrier signal means comprise an RF carrier signal means and an audio tone signal means; the audio tone signal means are adapted to modulate signals transmitted by the RF carrier signal means. The low frequency signal means are adapted to modulate signals transmitted by the carrier signal means, and the low frequency signal is provided to increase the level of electro-magnetic energy present at faults of the buried conductor. The carrier signal means are adapted to operate in a trace mode to locate the position of the buried conductor under the ground, and this trace mode is characterized by a continuous signal transmitted by the carrier signal means.

40 Claims, 12 Drawing Sheets

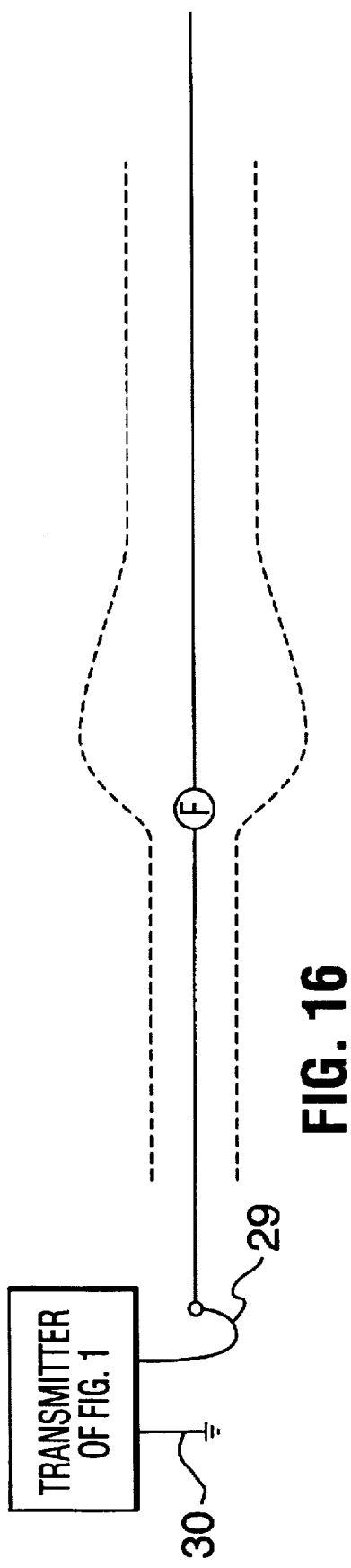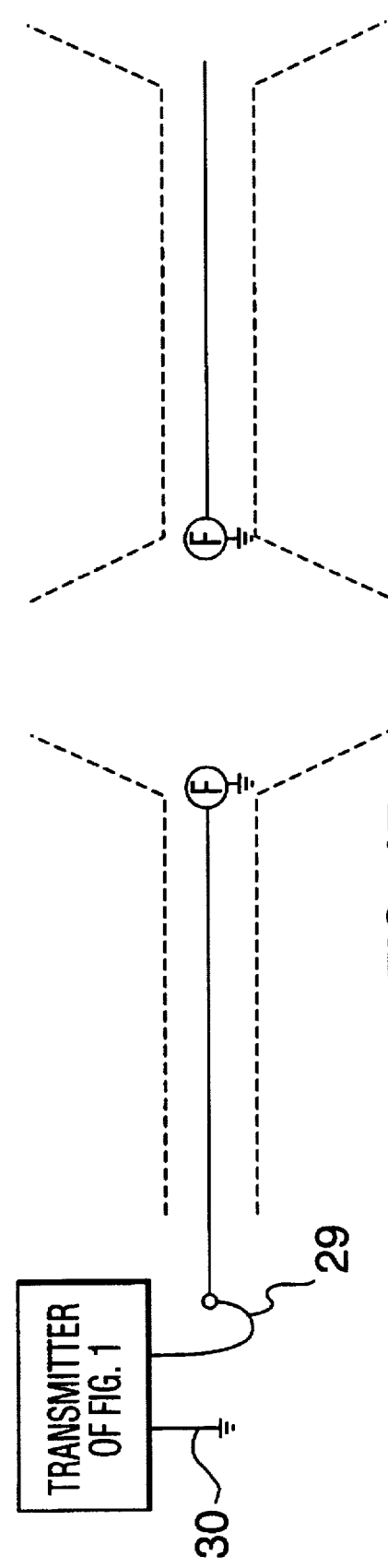

METHOD AND APPARATUS FOR LOCATING FALUTS IN BURIED CONDUCTORS

1. FIELD OF THE INVENTION

This invention relates to the tracing and location of all types of faults in buried insulated conductors, including faults with resistances of over one million ohms, non-metallic opens and faults on metallic sheaths resulting in conductor leakage to ground.

2. DESCRIPTION OF THE PRIOR ART

Telephone, CATV, and electrical power lines are often buried in the earth for aesthetic and cost reasons (no poles to maintain). These cables are often damaged by a wide range of causes: the act of burial, rodent attacks, frost heave, penetration by water, installation of new cables, and various construction activities are just some of the threats that can be experienced by buried cables. Various methods have been developed over the years to trace and locate faults in buried conductors.

An existing system, as disclosed in the U.S. Pat. No. 3,299,351 by Williams, works by detecting the phase shift of a low frequency AC test signal and a reference signal transmitted at one-half the frequency of the test signal, at a fault location by detecting the signals in the earth return path using differential probes and by then squaring and extracting the second harmonic of the phase of reference compared to the phase of the test signal. As a result, the phaseal relationship indicates direction to the fault.

The other known U.S. Pat. No. 3,991,363 to Lathrop adds an RF carrier to his system to allow for cable tracing by using antennas. This RF carrier is modulated by the test frequency and allows for phase comparisons between the output of differential probes in the earth return path and the signals received through antennas in the air over the cable. A phase reversal takes place between these two signals at a fault. This RF carrier also increases the conductor to earth coupling along the length of the conductor, and not just at the fault. This increases the leakage current between the conductor and earth resulting in a larger voltage gradient along the conductor path. As a result, an increased magnetic field above the surface of the earth to be exploited by an antenna and receiver.

In practice, these systems do not always work; multiple faults, high resistance shorts (over 1 million ohms), earth grounds, and non-metallic opens can cause these systems to fail to locate the fault.

SUMMARY OF THE INVENTION

Broadly, the present invention is related to an apparatus for detecting faults in buried conductors comprising:

transmitter means adapted to transmit electro-magnetic signals down the buried conductor, wherein said signal is provided to increase an electro-magnetic path or corridor existing at the surface of a ground above said buried conductor;

a detecting means adapted to detect electro-magnetic path or corridor and to detect electro-magnetic patches formed in said path or corridor, wherein said patches are located over the faults, and wherein said patches are characterized by presence of increased level of electro-magnetic energy caused by said faults. Said transmitter means is adapted to transmit a composite signal comprising a carrier signal transmitted by a carrier signal means and a low frequency signal transmitted by a low frequency means, and said carrier signal means comprises an RF carrier signal means and an audio tone signal means; wherein said audio tone signal means adapted to modulate signals transmitted by said RF carrier signal means.

In another embodiment, said low frequency signal means are adapted to modulate signals transmitted by said carrier signal means, and wherein said low frequency signal is provided to increase the level of electro-magnetic energy present at faults of said buried conductor. Said carrier signal means are adapted to operate in a trace mode provided to locate the position of said buried conductor under the ground, and wherein said trace mode is characterized by continuous signal transmitted by said carrier signal means. Said transmitter means is adapted to operate in a fault mode provided to detect presence of faults in said conductor, wherein in said fault mode said transmitter means is transmitting the composite signal. Said low frequency signal means are adapted to modulate signals transmitted by said carrier signal means, and said transmitter means further comprise a switch means adapted to switch between said trace mode and said fault mode.

In yet another embodiment of the present invention, said transmitter means further comprise an impedance matching network means adapted to connect said transmitter means to live lines without any disturbance caused by the signals transmitted by said transmitter means while allowing to detect faults in said conductor. Said impedance matching network comprises a transmitter output power level control circuitry means, and said detecting means comprise a fault sensing means connected to a receiver means. Said fault sensing means comprising a probe means adapted to pierce and detect presence of said electro-magnetic path or corridor and said patches above said buried conductor, and said probe means comprise a single metallic probe connected to a band pass filter circuit means, wherein said band pass filter circuit means are tuned exactly to a frequency transmitted by said carrier signal means, thus allowing to control the level of energy passing through said band pass filter circuit means.

In still another embodiment, said receiver means further comprising a display means adapted to display the presence of said electro-magnetic path or corridor above said buried conductor detected by said fault sensing means, and wherein said display means also adapted to display the presence said electro-magnetic signal energy patches formed over said faults. Said fault sensing means are adapted to operate in a peak mode provided to detect an abrupt increase of the electro-magnetic signal energy level existing above said faults, and said display means comprise an audio means adapted to provide audio signals displaying presence of said electro-magnetic path or corridor and said electro-magnetic signal energy patches existing over said faults. Said display means comprising a signal strength means adapted to display presence of said electro-magnetic path or corridor and said electro-magnetic signal energy patches existing over said faults. Said signal strength means comprise a root mean square conversion circuit means adapted to transmit the audio signal received from a headset means into a voltage to be displayed on a volt meter, and said fault sensing means comprise an antenna means adapted to detect the presence of said electro-magnetic path or corridor above said buried conductor and said electro-magnetic patches located over said faults.

Also, said antenna means is adapted to operate in a null mode provided to detect a signal null in the air over said conductor, and wherein the presence of said faults is characterized by abrupt spreading of peaks on each side of the signal null above said faults.

In still yet another embodiment of the present invention, the invention is related to a method for detecting faults in buried conductor comprising the steps of:

transmitting an electro-magnetic signals down the conductor, wherein said signal is adapted to increase electro-magnetic path or corridor existing at the surface of the ground above said buried conductor;

detecting electro-magnetic signal energy patches formed in said path or corridor, wherein said patches are located over said faults, and wherein said patches characterized by increased level of electro-magnetic energy existing over said faults.

In yet still another embodiment, said electro-magnetic signal comprises a composite signal, and said composite signal comprises a carrier signal and a low frequency signal. Said carried signal comprises high frequency RF signal and audio tone signal modulating said RF signal, wherein said carrier signal is provided to detect location of said buried conductor under the ground. Said composite signal is provided to detect location of faults of said conductor, and detection of said faults is provided by a fault sensing means connected to a receiver means. Said fault sensing means comprises a probe means, and wherein detection of said faults is provided by means of piercing of the electro-magnet path or corridor by said probe means and comparing the level of electro-magnetic signal energy of unfaulted sections of said conductor and faulted sections of said conductor, wherein signal energy level existing over said faulted sections is substantially greater then signal energy level existing over said unfaulted sections.

In still another embodiment, said conductor is accommodated within a multi-conductor cable, and wherein detection of said faults is provided by means of suppressing all signals transmitted by any other faulted cable buried in the close vicinity of said multi-conductor cable, wherein said suppression is provided by means of grounding other conductors accommodated within said multi-conductor cable except the one being tested. Said fault sensing means operate in a "null-peak-null" mode characterized by a sudden ramp up or increase in signal strength followed by a sudden sharp drop of said signal strength, or said fault sensing means are operating in a "peak" mode characterized by a sudden peak in signal strength after a low flat signal level was detected. Said fault sensing means comprise an antenna means, and wherein detection of said faults is provided by means of detecting a signal null over said buried conductor, wherein faulted sections of said conductor characterized by an abrupt spreading of the peaks on each side of the signal null detected by said antenna means, and wherein spreading of said peaks is directed perpendicularly to the conductor's run. Said electro-magnetic signals are transmitted by a transmitter means provided with a ground return means, and the shape of said electro-magnetic signal energy patches are controlled by means of the positioning of said ground return means relative to the location of said buried conductor. Said ground return means are positioned on a distance away from said buried conductor, and wherein said patch forming an offset lobe configuration, wherein the configuration of said offset lobe allows detection of the exact location of the fault of said buried conductor.

The present invention relates to a method and apparatus for detecting the location of a faulted conductor(s) inside a buried insulated cable and the detection of faulted sheaths on buried cable. The invention utilizes the existence of an electromagnetic energy path or corridor present on the surface of the ground above a buried cable, caused when a composite electromagnetic signal is transmitted down the faulted conductor and then physically or capacitively coupling to the earth medium. This energy path has more energy present over the faults in said conductor which can be detected with antennas in the air over the buried cable.

To increase this effect, the present invention uses a composite electro-magnetic wave consisting of an RF carrier signal modulated by an audio tone, and by then modulating both signals by a frequency off less then 100 hertz. In the apparatus used, an RF carrier signal of 455 khz was used to simplify the receiver and to keep the carrier harmonics off frequencies used by telephone companies to multiplex voice and data communication lines. An audio tone of 600 or 800 hertz was selected by a switch. The 800 hertz tone gives a clearer image of the shape of the peaks on each side of the null detected over a buried cable. And finally an 8 or 16 hertz square wave is used to modulate both signals, which results in more energy being present at a conductor fault.

One aspect of the invention is provided by means of a single metallic probe connected to a 455 KHZ bandpass filter which in turn is connected to a receiver. Detection of faults is provided by means of probing the ground over a faulted buried conductor through which a composite electromagnetic signal is flowing from a transmitter. Electromagnetic energy present at the surface over the faults will be greater when compared to the energy existing over unfaulted sections of the conductor.

It is also possible to trace the same buried conductor by utilizing an antenna and receiver, and tracing the conductor by following the null detected in the air over the conductor. The spacing of the peaks on each side of the null which suddenly begins to spread perpendicular to the conductor run indicates that the user has just crossed over a fault in the buried conductor.

By sampling the modulated content of the magnetic field with an antenna and receiver in the air over the buried conductor, and comparing it with the modulation content of the differentially detected field in the ground along the axis of the conductor, the user can ascertain the direction to the fault by the phase shift between the two signals in a similar manner, as described by Lathrop.

BRIEF DESCRIPTION OF THE DRAWINGS

FIG. 16 Top view showing the shape of the signal null over a buried cable as seen using the antenna, and how the null will spread at the location of a fault.

FIG. 17 Top view showing how the null will spread into infinity at a gross fault and then come back together at the next fault.

DETAILED DESCRIPTION

Figure 1:
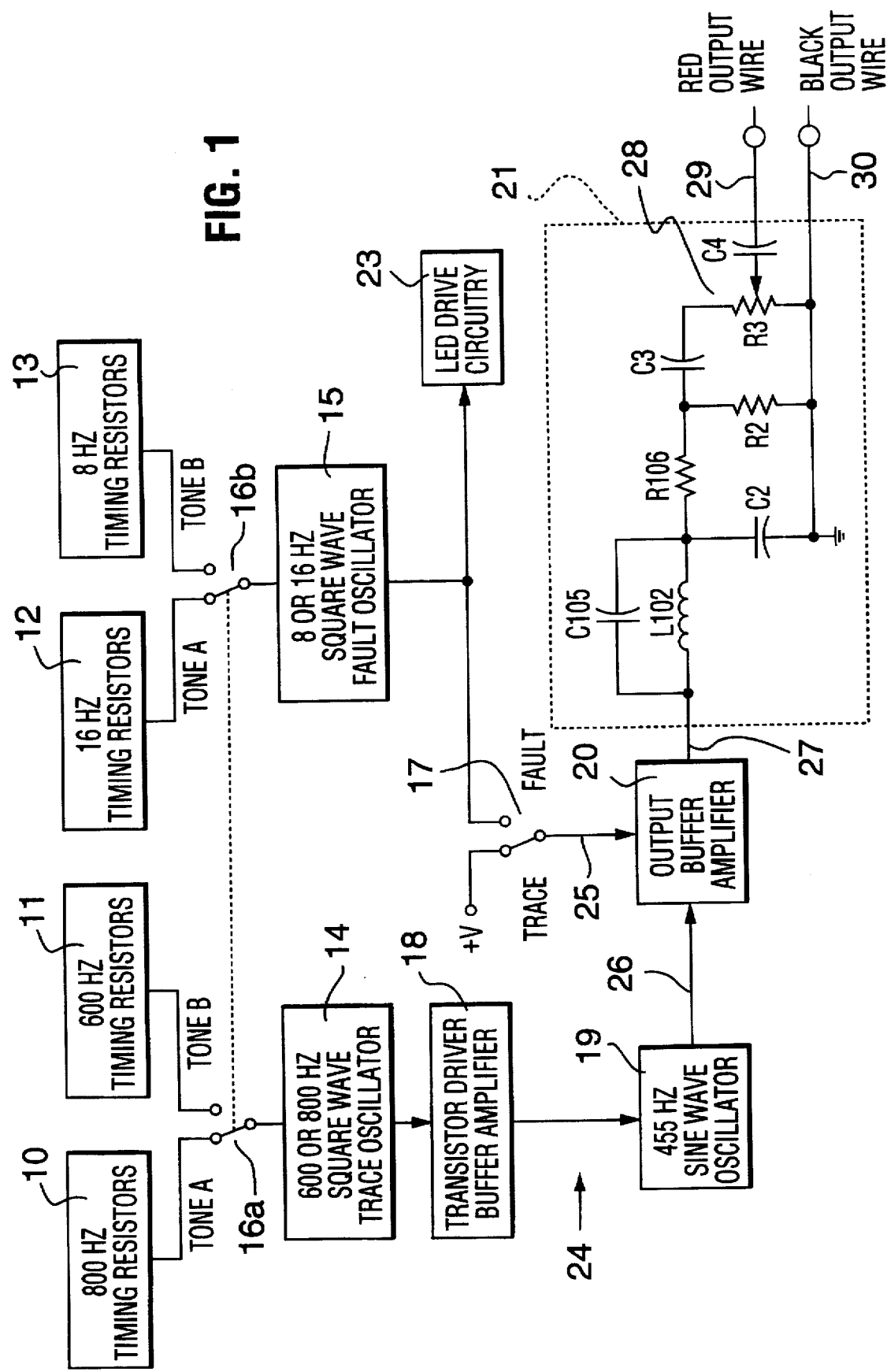
FIG. 1 Block-diagram of the transmitter according to the present invention.
Figure 2:
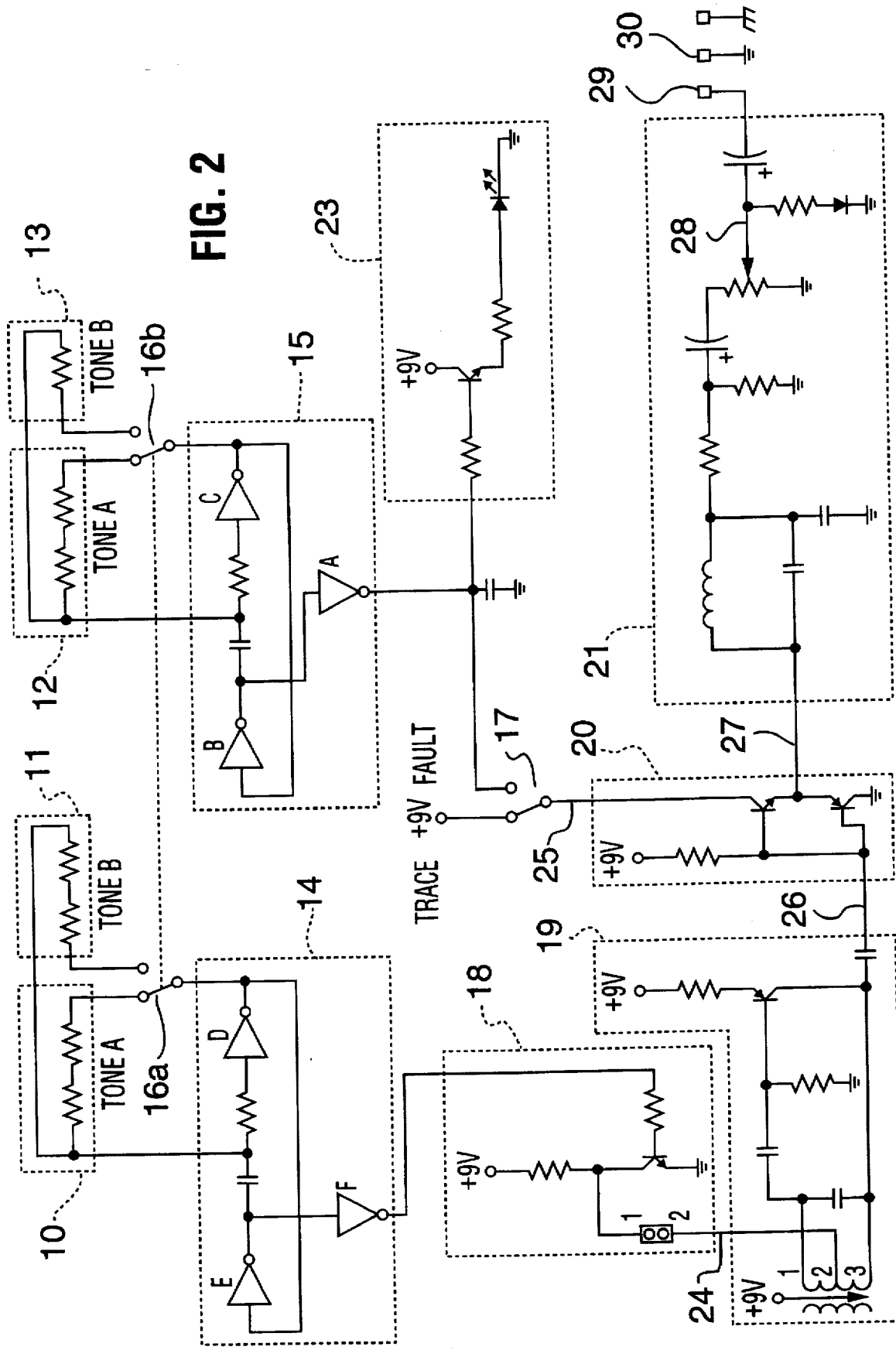
FIG. 2 Detailed view of the transmitter of FIG. 1.

FIG. 1 shows a block-diagram of the transmitter means according to the present invention. FIG. 2 shows a detailed view of the same transmitter. An RF sine wave oscillator 19, set to oscillate at 455 khz is gaited on/off by a free running square wave oscillator 14 selected by switch 16.

If switch 16a is in Tone A position, then oscillator timing resistors 10 are selected. These oscillator timing resistors are set to oscillate oscillator 14 at 800 hertz. If switch 16a is in Tone B position then oscillator timing resistors 11 are selected. These timing resistors are set to oscillate oscillator 14 at 600 hertz.

Figure 5:
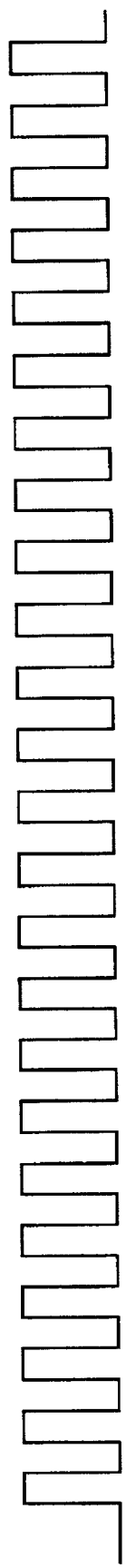
FIG. 5 Output signal from the transmitter's Tone Oscillator.

Oscillator 14 outputs a square wave signal that goes to a buffer/driver amplifier 18. This buffer/driver amplifier 18 gates the RF amplifier 19 on/off. The signal seen at 24 is then either a 600 hertz or 800 hertz square wave tone as shown by FIG. 5.

The output 26 of the RF sine wave oscillator 19 is a continuous chain of 800 or 600 hertz blocks of RF energy at 455 khz. This modulated signal is sent to an oscillator buffer/driver 20. This output buffer/driver is itself gaited on/off by a free running square wave oscillator 15 selected by switch 16b. The RF sine wave oscillator 19 and free running square wave oscillator 14 comprise a carrier means adapted to operate in a trace mode provided to locate the position of buried conductors under the ground, wherein said trace mode is characterized by a continuous signal transmitted by said carrier means.

If switch 16b is in Tone A position, then oscillator timing resistors 12 are selected. These oscillator timing resistors are set to oscillate oscillator 15 at 16 hertz. If switch 16b is in Tone B position then oscillator timing resistors 13 are selected. These oscillator timing resistors are set to oscillate oscillator 15 at 8 hertz.

A switch 17 selects whether the low frequency signal means or oscillator 15 gates the buffer/driver 20 on/off (FAULT MODE) or a steady positive power is applied to the buffer/driver 20, allowing the buffer/diver 20 to pass the modulated blocks of 455 khz (TRACE MODE) without the low frequency signals being added.

As a result, the signals seen at 25 are either a continuous chain of square waves oscillating at 16 or 8 hertz in FAULT MODE, or are a steady positive voltage in TRACE MODE.

Figure 6:
FIG. 6 Output signal from the transmitter's Oscillator Buffer/Driver Amplifter showing the modulated blocks of RF energy modulated by both the Tone oscillator and the Fault oscillator.

If the switch is in FAULT MODE, then the output 27 of the buffer driver 20 is a composite signal comprising an 8 or 16 hertz signal, gating the blocks of 600 or 800 hertz signal which are modulating the 455 khz signal. This is shown in FIG. 6.

If the switch 17 is in TRACE MODE, then the output 27 of the buffer/driver 20 is a continuous signal of 455 khz energy modulated into blocks of 600 or 800 hertz tone.

The output 27 of the buffer/driver 20 is fed to a filter and impedance matching network means 21 which includes an output power level control means or the transmitters output power level control circuitry 28. This allows the transmitter to be connected to live telephone lines, ISDN lines, and modem lines without disrupting the service provided on those facilities while still allowing cable tracing and fault locating to be performed transparently. This new circuitry is one of the most advantageous features of the present invention.

Figure 7:
FIG. 7 Output signal from the transmitter as seen across the red and black output wires showing the composite 600 or 800 hertz and 8 or 16 hertz RF modulation present.

FIG. 7 shows the signal present across the RED 29 and the BLACK 30 output wires of the transmitter when switch 17 is in Fault Mode. And switch 16a and 16b are set to Tone A.

Figure 3:
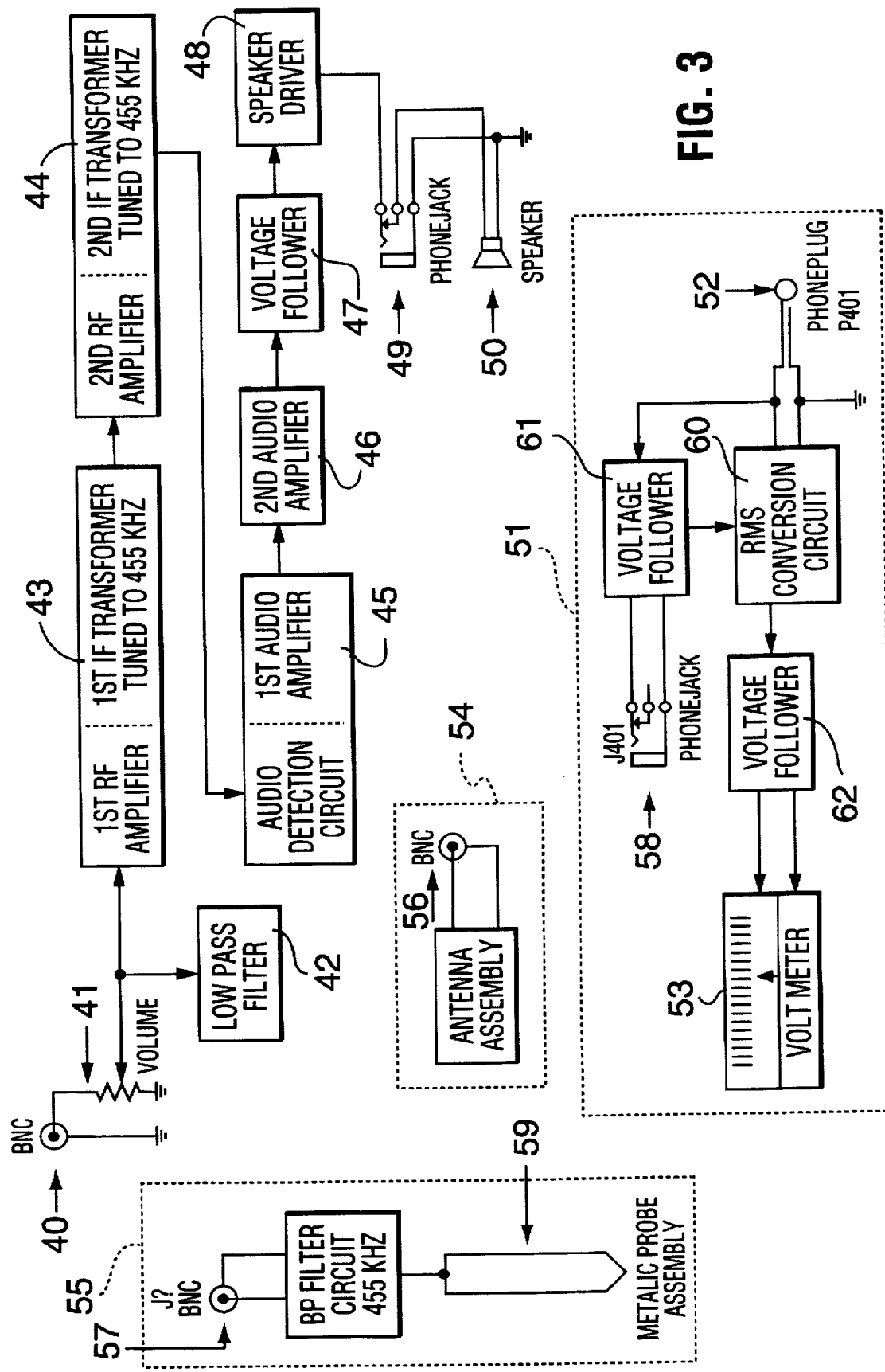
FIG. 3 Block-diagram of the receiver according to the present invention.
Figure 4:
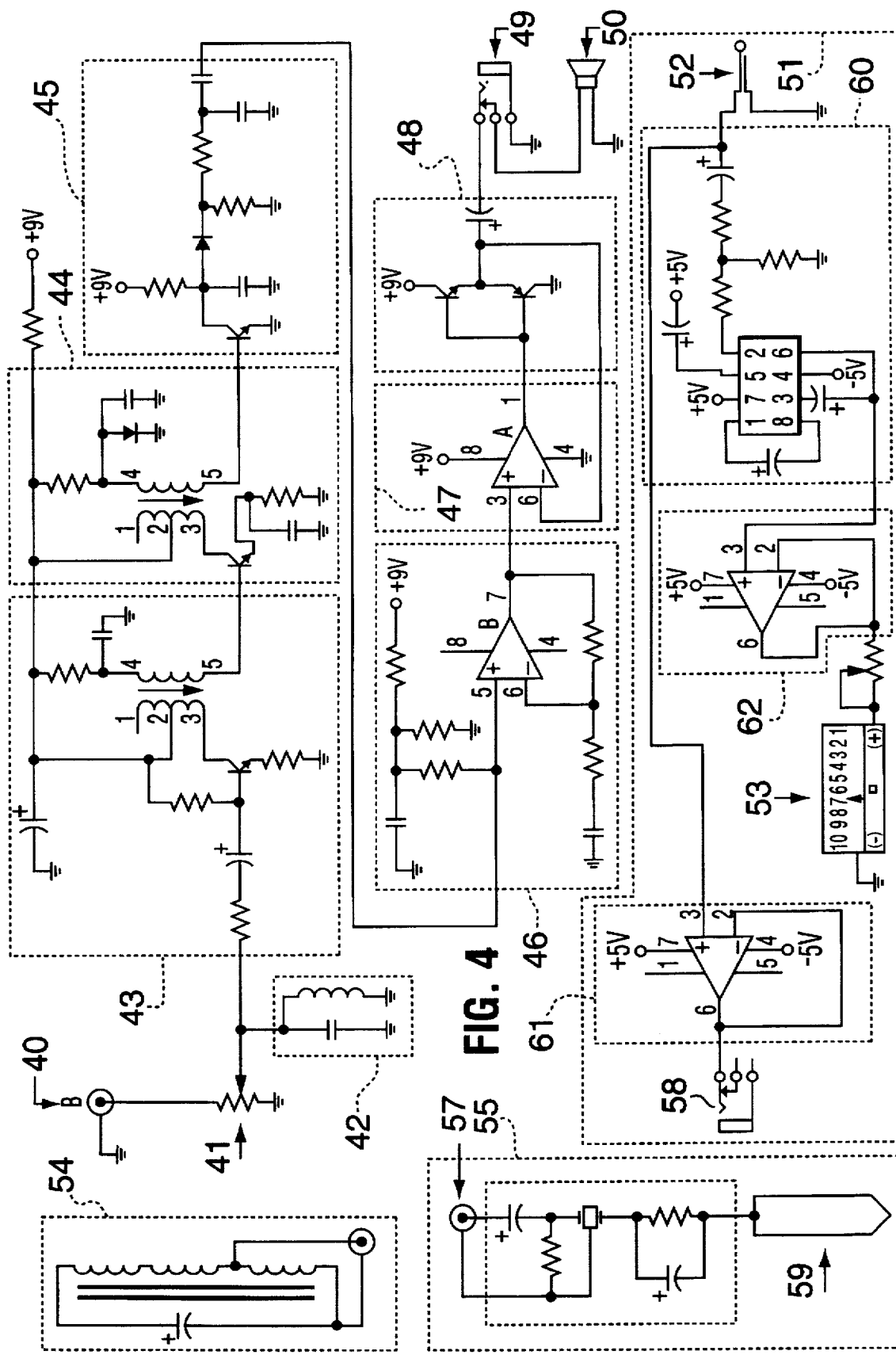
FIG. 4 Detailed view of the receiver of FIG. 3.

A block-diagram of a receiver according to the invention is shown in FIG. 3. A detailed view of the receiver is shown in FIG. 4.

The fault sensing means or metallic probe assembly 55 connects to the receiver means through a BNC connector 57 at the probe and BNC connector 40 at the receiver. This connection is made with a BNC patch cable. This combination of the receiver and probe comprise a detecting means.

The probe consists of a single metallic probe connected by a wire to a Band Pass filter circuit 63. The Band Pass filter is a ceramic type tuned to 455 KHZ frequency. As a result, only energy oscillating at 455 KHZ (±10 KHZ) will pass through the Band Pass filter to the BNC connector 57. Such combination of single metallic probe and Band Pass filter circuitry is also one of the most important features of the present invention. The use of such combination is not restricted only to detecting faults in buried cables and may be used for any testing procedure.

The Antenna Assembly 54 consists of a tuned antenna coil on a ferrite rod that passes electromagnetic energy at 455 KHZ (±40 KHZ) to BNC connector 56 that is normally connected directly to the receiver BNC connector 40. However, the antenna assembly can be connected to the receiver BNC connector 40 through a BNC patch cable allowing the antenna to be installed at the base of a probe. In this case, the antenna assembly is operating as fault sensing means, and may be placed at the base of the probe to make tracing procedure easier since the user does not have to always bend over.

The receiver input 40 connects to the top of a variable resistor 41. The other end is connected to the battery negative. This variable resistor 41 controls how much energy reaches the first RF amplifier 43. The input signal is taken from the wiper arm of the variable resistor 41 and passed by a low pass filter 42 to eliminate AM radio signals.

The output of the low pass filter 42 is capacitor coupled to the first RF amplifier 43. This RF amplifier 43 is set with a gain of 160 or greater. The collector of the first RF amplifier 43 is connected to an IF transformer timed to 455 khz. The secondary of the first IF transformer feeds the base of the second RF amplifier 44. This amplifier 44 is also set for a gain of 160 or greater. The collector also feeds an IF transformer tuned to 455 khz.

The secondary of the second IF transformer feeds an AF detector 45 consisting of diodes and a transistor set to a gain of 200 or more. The output of this first AF amplifier is typically 300 mv for a strong input signal. The output of the first AF amplifier 45 is capacitive coupled to an op-amp amplifier 46 set for a gain of 50.

The output of the op-amp amplifier feeds an op-amp voltage follower 47 to buffer the second AF amplifier 46. The voltage follower 47 feeds the speaker driver amplifier 48 which drives an onboard speaker 50 through a normally closed headset jack 49.

As an option, a signal strength meter means 51 can be connected to the headset output jack 49 through the headset plug 52. This device, 51, consists of an Root Mean Square (RMS) conversion circuit 60 that translates the audio signal from the headset jack 49 into a voltage that is sent to a voltage follower buffer/driver 62 that then passes the signal to a volt meter 53 for display.

Another voltage follower circuit 61, buffers and drives a headset jack 58, so that a headset can be connected to the Root Mean Square display unit 51. The signal being tapped off the input headset plug 52. The signal strength meter unit 51 could also be incorporated within the receiver as one unit; however, the cost of such a combined device will be more expensive than a separate unit. It should be emphasized that such an arrangement of the signal strength meter 51 is not restricted to use with the receiver of the present invention, and may be plugged into any other modification of the cable tracing unit provided with headset jack.

PROBING SIGNAL PATCHES:

The signal from the transmitter travelling down a faulted conductor inside a buried insulated cable causes a unique electromagnetic energy path or corridor to be present on the earth's surface above the buried cable. By using a metallic probe 55 connected to the receiver of FIG. 3, the user can follow the path of the buried conductor of cable C by touching the probe 55 to the earth's surface over the buried cable and thus detecting this energy.

As the user walks down the path of the cable probing the earth, an RF carrier signal modulated at 600 or 800 hz will be detected. This signal is presented to the user through a speaker on the receiver 50 or displayed on an RMS meter 51 connected to the receiver's headset jack 49. Also audible or detected is the low frequency test signal at 8 or 16 hertz if the transmitter is in fault mode, which would normally be the case.

Figure 8:
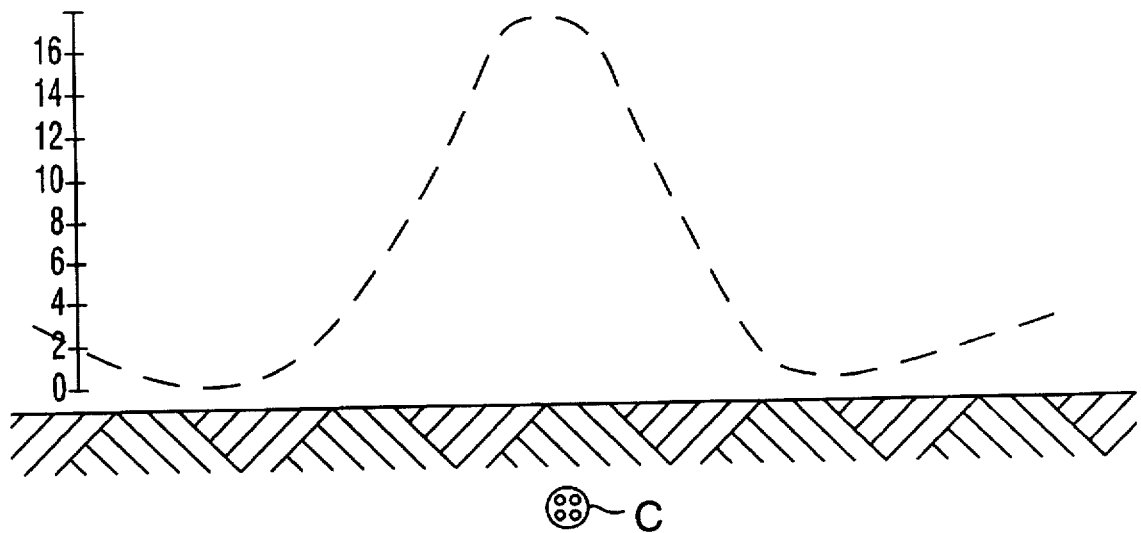
FIG. 8 End view showing the signal peak as detected over a buried cable while using the metallic probe with the receiver.
Figure 9:
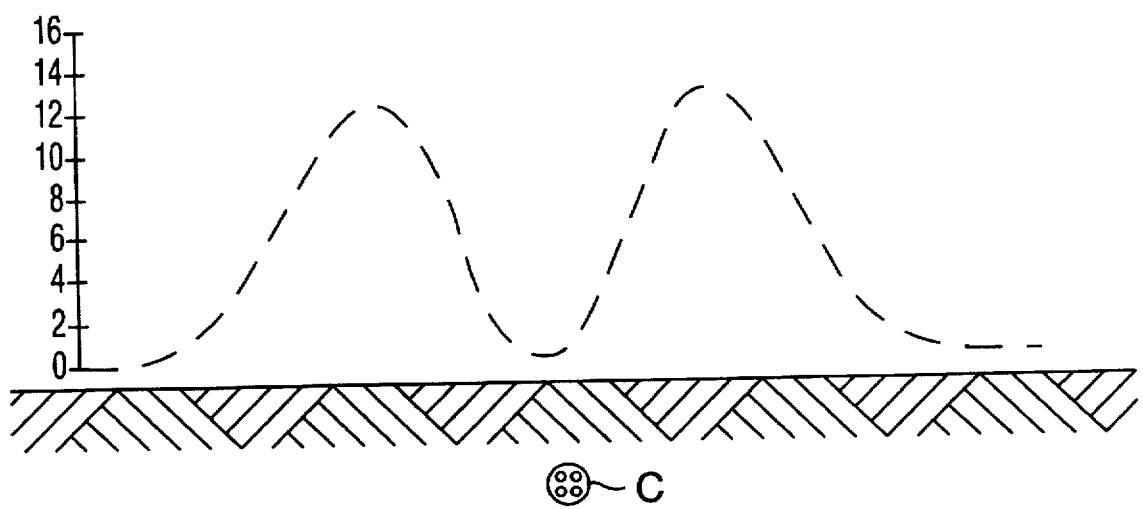
FIG. 9 End view showing the signal null as detected over a buried cable while using the antenna with the receiver.

The tones will be loudest or strongest over the buried cable and will drop off immediately to the sides of the cable's run as shown in FIG. 8. As such, the receiver/probe combination are working in Peak Mode, as opposed to the Null Mode when using an antenna 54 with the receiver as shown in FIG. 9.

Figure 10:
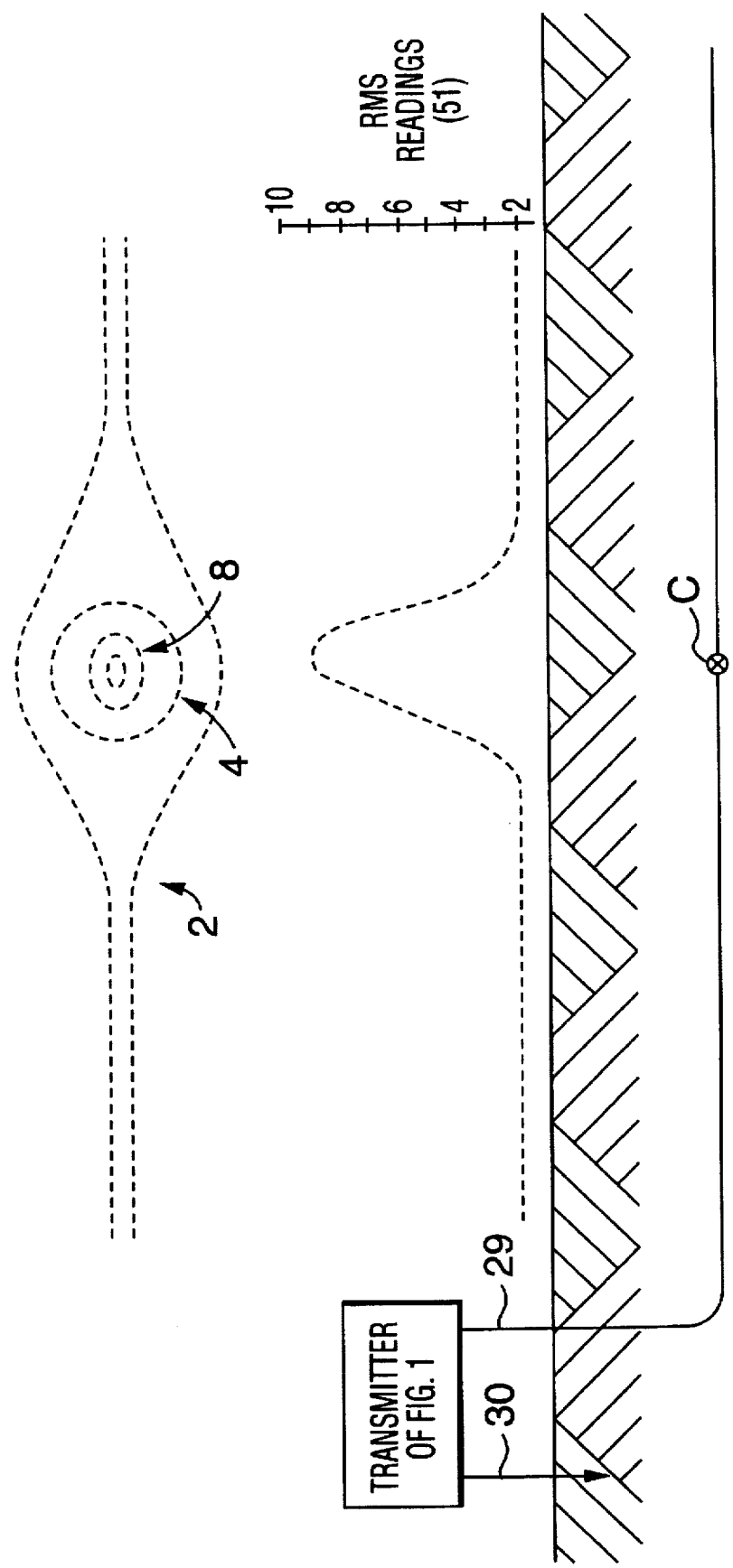
FIG. 10 Side and top view of the signal levels present over the path of a faulted buried cable as detected using the metallic probe and receiver.

When the user probes the earth and reaches a fault location, the signal level will rise abruptly over the fault. By probing, the user will observe that a strong signal patch exists over the fault. This is shown by FIG. 10.

Figure 11:
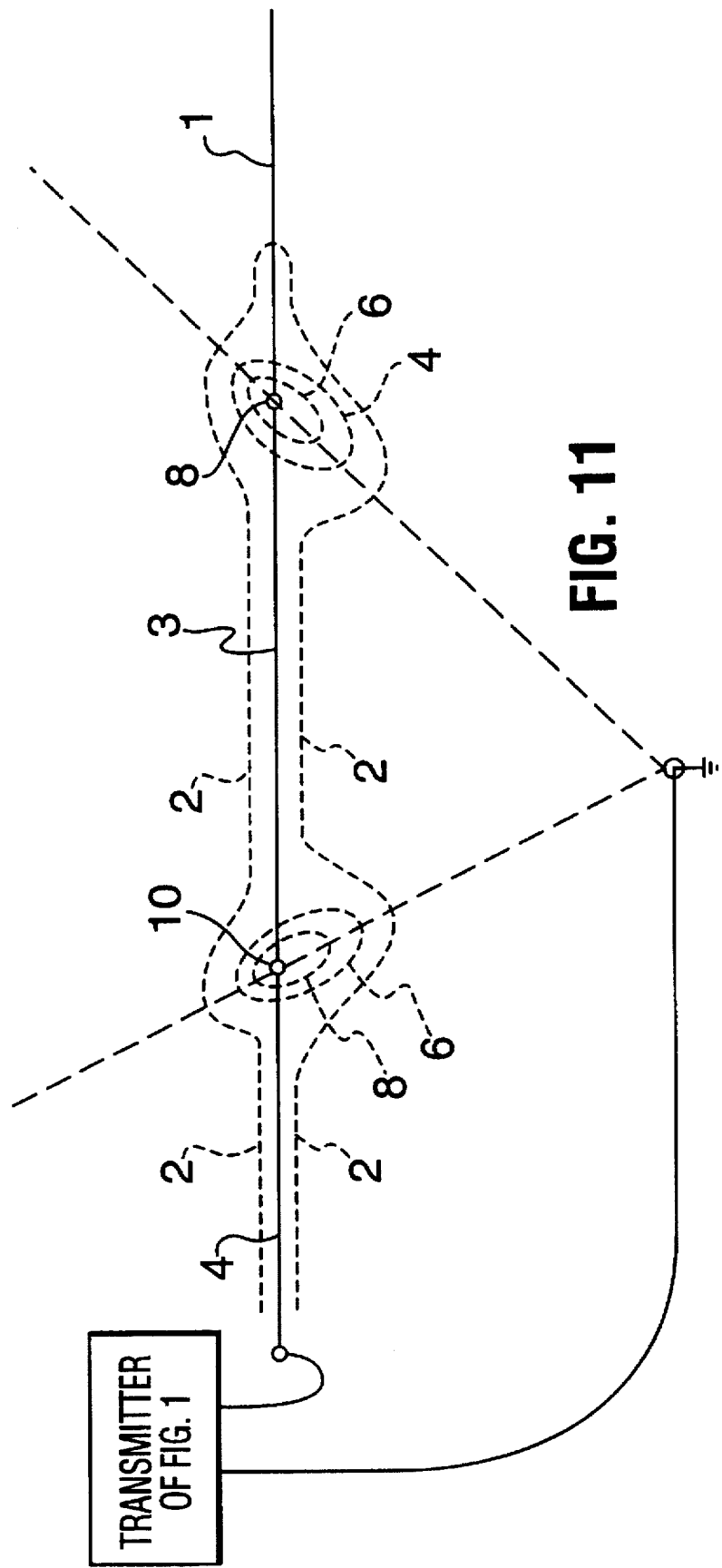
FIG. 11 Top view of the shape of energy patches on a multi-faulted buried cable showing the distribution of energy detected and the effect of the location of the earth return ground rod on the shape of the energy lobes as seen by the metallic probe and receiver.

By moving past the fault, the signal levels will drop, and the width of the peak over the cable will narrow down to the original size it was prior to the fault. The user can probe to the next fault, where again, a strong signal patch will be detected over the fault. This is shown in FIG. 11 on which numbers indicate energy on the scale of 0 to 10 using the RMS unit 51.

With the transmitter's earth ground return located near the connection to the faulted conductor, or in line with the buried cable run but in the opposite direction, the shape of the signal patch over conductor's fault will be oval.

Since there is a certain amount of coupling between the user's body and the electromagnetic field over the buried cable in the normal practice it would be recommended to trace out the wire path using the antenna while walking away from the transmitter, ensuring that the user stays on top of the buried cable C. To probe the ground with the metallic probe the user will walk back toward the transmitter probing the earth as he goes, while ensuring that he stays on the path of the buried cable.

FIG. 12, FIG. 13, FIG. 14 and FIG. 15 show the signals detected on an actual faulted cable using the RMS unit 51 connected to the receiver's of FIG. 3's headset jack 49. The signals are being picked up by using the metallic probe 55 connected to the BNC connector 40 of the receiver using a BNC patch cord. The transmitter of FIG. 1 is connected to a single conductor inside an insulated two (2) pair buried cable C. The transmitter's red output wire 29 is connected to the conductor under test, and the transmitter's black wire 30 is connected to a ground rod located near the transmitter. The scale at the bottom of the drawings is in feet away from the transmitter, and as a result, the transmitter is on the left of the figures. The user then walks back toward the transmitter noting the readings on the RMS unit 51 as he probes the ground using the metallic probe assembly 55. In this case, the user could locate the faults just by listening to the audio tones from the receiver, which would be the normal practice.

The test cable is buried in a common service trench with another faulted two (2) pair insulated service cable that is also terminated open at both ends. Both cables are buried down over one foot in depth for a length of about forty five (45) feet. All tests are done only on the test cable.

Figure 12:
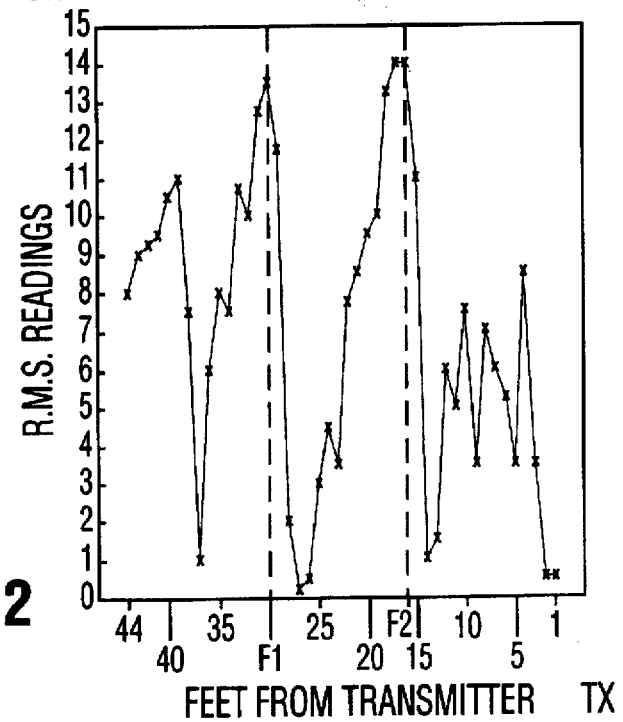
FIG. 12 Graph of energy detected as displayed by the RMS unit connected to the receiver showing showing two energy peaks located over two faults while transmitting down a faulted conductor.
Figure 13:
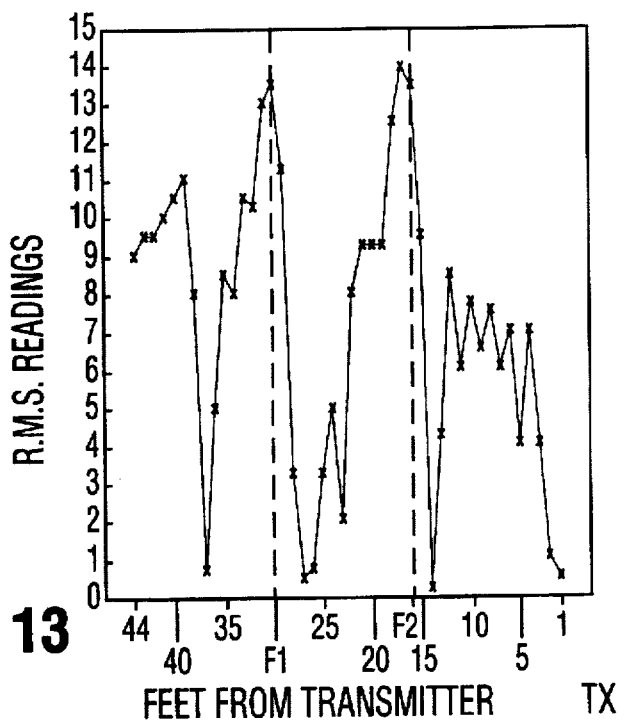
FIG. 13 Graph of energy detected while transmitting down an unfaulted conductor in a faulted cable showing the same energy distribution as FIG. 12.

In FIG. 12, the transmitter is connected to a faulted conductor, in this case, the orange wire. All other wires are open at each end of the cable. In FIG. 13 the transmitter is connected to an unfaulted conductor, the red wire. All other conductors being open at both ends.

As can be seen in FIG. 12 and FIG. 13, connecting the transmitter to a faulted or an unfaulted conductor inside the cable C results in the same configuration of signals being detected at the surface. Starting at the forty four (44) foot mark and walking back towards the transmitter, the user observes a sharp drop in signal at thirty six (36) feet followed by a peak in signal strength at thirty (30) feet, marked F1. This is followed by a very sharp drop in signal right after the fault at F1.

This drop-peak-drop is marking a fault in the other cable in the same service trench. The system will usually energize the faults in all cables sharing the same service trench, but, yet, do not have the transmitter connected to them.

As the user continues down the cable path, another sharp increase in signal strength is seen peaking at seventeen (17), eighteen (18) feet, marked F2, followed by a sharp drop at fourteen (14) feet.

This is the fault in the cable to which the transmitter is connected to. In this case, the orange conductor has a three million ohm short to ground on it. However, the unfaulted red conductor clearly shows the location of this fault (F2) and the fault on the other cable (F1) when the transmitter is connected to it as shown by FIG. 13.

Figure 14:
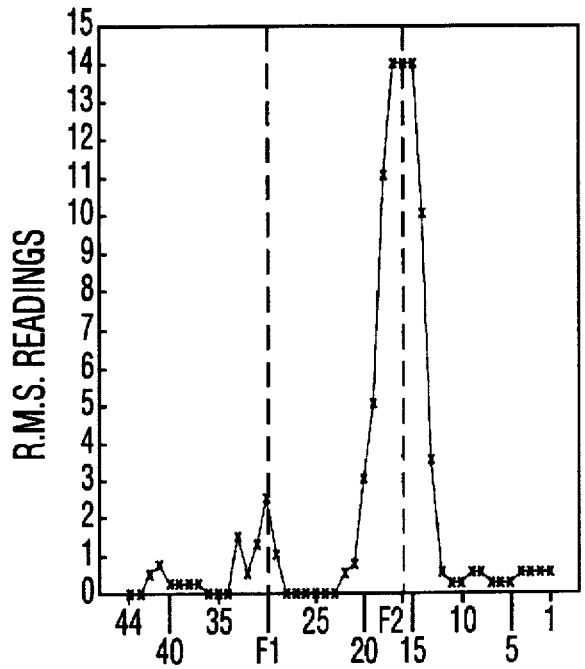
FIG. 14 Graph showing the effect of running a ground through a faulted cable to suppress the display of faults in adjacent cables and to suppress the energy from unfaulted sections of cable.
Figure 15:
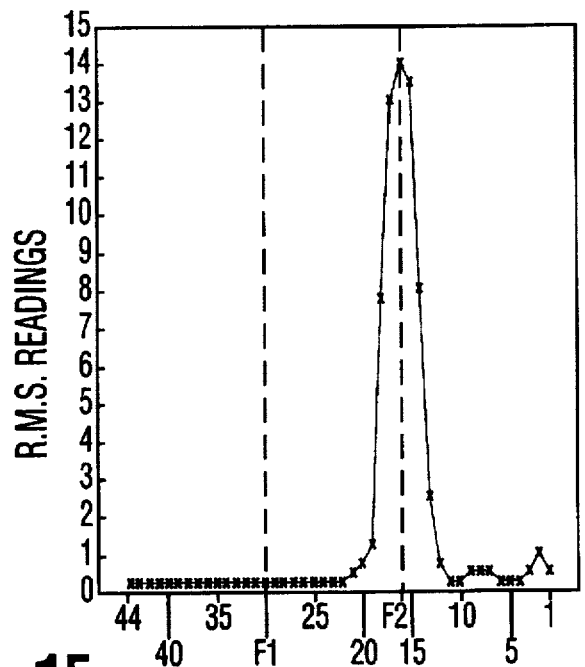
FIG. 15 Graph showing the effect of grounding all the conductors except the conductor connected to the transmitter in order to suppress the display of faults in adjacent cables and to suppress the energy from un-faulted sections of cable.

FIG. 14 and FIG. 15 show how to suppress the fault signal from the other faulted cables located in the same service trench. FIG. 14 shows the same cable with the transmitter connected to the faulted orange conductor. However, one other conductor in this cable has been grounded at the transmitter, in this case the unfaulted red conductor. This causes the effect that there will be less coupling to the earth and to adjacent cables in the common service trench, and as the result, the energy previously detected at F1 will be suppressed considerably. Note that the conductor fault at F2 has now a sharp peak configuration, which is the other type of signal configuration marking the location of a conductor' fault.

FIG. 15 has the transmitter connected to the faulted orange conductor and all other conductors in the cable are grounded at the transmitter. As can be seen, all cross coupling to adjacent cables in the service trench have been suppressed. There is now no energy visible at the F1 fault and a very tall spike of energy centred on the conductor fault located at F2.

In the four figures above, the conductors at the end of the cable away from the transmitter were separated and left open.

As shown above, there are two types of signal configurations that denote the location of a cable fault, such as: the "null-peak-null" effect, and the sudden sharp peak. Normally, the user will miss the first "null" in the "null-peak-null" signal since the first null will be only a foot or so in length as seen in FIG. 12 and FIG. 13. Therefore, the user would be looking for a sudden ramp up in signal strenght followed by a sudden sharp drop in signal strenght. This would be the classic indicator of a fault, with the actual fault located just before the sudden sharp drop.

The other indicator of a fault is the sudden peak in signal strenght after a long low flat signal level was detected as shown in FIG. 14 and FIG. 15.

If the buried cable C is at different depths along its lenght (which is often the case), the user will notice a slow ramping up in signal strenght and a slow ramping down in signal strenght as the buried cable changes depth. The same effect will be noticed if the buried cable makes a sharp turn in direction. However, there will be no sudden sharp peak in signal strength or the sudden sharp drop following a peak.

Buried splices will, however, cause the sharp "peak" or the "null-peak-null" effect to happen and as a result will be detected as a "fault" on the cable. In this case "buried splices" is an arrangement wherein 2 cables are joined together and the conductors inside those cables are joined together. The whole connection is sealed and re-buried.

Various conductor faults, of up to three (3) million ohms (3 meg), could be detected using the method according to the present invention. High resistance opens which will be missed by most the known equipment are easily detected by using the probing method of the present invention. Those features are very important advantages of the present invention.

GROUND LOCATION FOR PROBING:

The position of the transmitter's earth ground return connection can effect the shape of the signal patch on the surface of the earth over a buried faulted conductor. If the transmitter's earth ground return lead is connected to a ground rod located halfway down the buried cable run and off to one side by 10 to 20 feet, an offset lobe can be created at the site of the signal patch over a faulted cable. FIG. 11 shows this effect on two faults in a buried cable.

By probing, the user will find that the signal patches are offset with more signal on the side of the cable C closest to the transmitter's ground return. In practice, this makes pin-pointing the location of a conductor fault very precise, which is considerable advantage of the present invention. The user has both the location of the most abrupt rise in signal along the cable path and the shape of the signal lobe, which points toward the ground return rod. By mapping out both effects as shown in FIG. 11, the user can precisely locate the conductor faults within one foot or less in most of the cases.

If the ground return is placed inline with the buried cable C, but in the opposite direction, or to one side of the connection point of the transmitter to the buried cable (which is the normal practice), the signal patches will be symmetrical at the cable faults along the axis of the cable path.

THE SPREADING NULL:

A clear null can be detected over the buried cable by connecting a transmitter to a faulted conductor, which runs inside the buried cable, and by walking down the path of the buried cable C using an antenna connected to a receiver and sweeping the antenna perpendicularly to the path. The null will have sharp peaks as shown in FIG. 9. These peaks will have a fast rate of rise giving a clear crisp "Tone-Null-Tone" which is heard through a speaker connected to the receiver. The tones heard are the modulated 600 or 800 hz tones generated by the transmitter at 455 khz as well as the low frequency 8 or 16 hertz signals (if the transmitter is in Fault Mode).

When the user, while sweeping the antenna, crosses over a fault in the conductor, a very noticeable spreading of the null will be apparent. This is shown in FIG. 16. The conductor fault will be located at the start of the spreading null. If the ground return for the transmitter is located near the connection point of the transmitter or inline with the cable C, but in the opposite direction of the cable run, the shape of the null at the conductor fault will often be "tear" shaped, wherein the actual fault is located at the start of the "tear" shape.

As the user walks past the fault, while sweeping the antenna perpendicular to the cable run, he will notice that the null will refocus three (3) to six (6) feet past the fault. However, the refocused null will not be as narrow as the null prior to the fault. The rate of rise of the peaks will not be as fast, and, as a result, the "Tone-Null-Tone" will not be as crisp as it was before the fault. The signal is still discernable, and the cable can be traced to the next fault.

At the next fault, a similar effect will occur: the null will dramatically spread. In case of substantial faults, the signal can refocus or spread into infinity as shown in FIG. 17; this is based on the severity of those faults.

Figure 18:
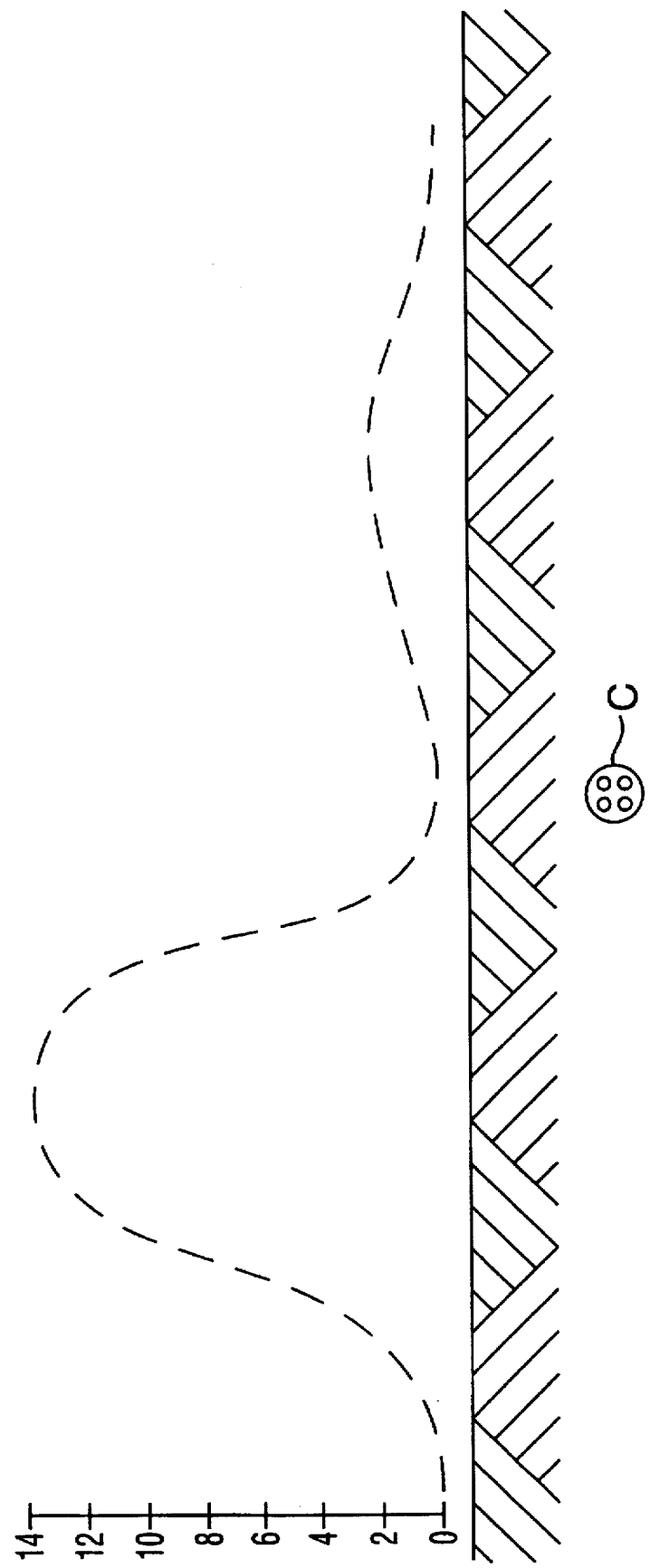
FIG. 18 End view of a one sided null as detected using the antenna showing that the buried cable is located at the inside edge of the one sided peak.

GROUND LOCATION FOR NULLING:

A similar effect happens with the null method. The shape of the null detected by using the antenna and receiver will be changed when the earth ground return is placed in the middle of a cable run 10 to 20 feet away. A sharp null will be evident as the user walks down the cable run swinging the antenna perpendicularly to the cable run (FIG. 9). When the user reaches the first fault, the shape of the null will shift abruptly. The user will notice that at the fault there will be a peak on the ground return's side of the cable, while on the side opposite the ground return, the peak will fade out to a very low flat signal, and as a consequence, gives a clear loud one-sided null effect over the cable fault as seen in FIG. 18.

As the user walks past the cable fault, the two-sided null (see FIG. 9) will reappear and now become wider than before the fault. The peak on the side opposite the ground return will now be flatter and have less signal. As the antenna is swept across the cable path, the null will have a marked difference in rate of rise of signal on one side.

There will again be an abrupt change in the shape of the null when the user reaches the next conductor fault. The signal will again be a one-sided peak with the peak on the side of the cable closest to the transmitter's earth ground return.

NORMAL FIELD PRACTICE

In normal practice of tracing and locating faults in a buried cable, the transmitter is connected to one end of the cable C and is switched into Fault Mode. Usually Trace Mode is used inside buildings to trace wires in the walls, ceilings and floors. By using the antenna and receiver combination, the user will trace out the null while walking away from the Transmitter and take notes of the location of any spreading null. After tracing out the cable path with the antenna, the user then walks back towards the transmitter probing the ground over the cable with the metallic probe connected to the receiver.

Most faults are indicated by a sudden null followed by a fast ramp up in signal strength followed by a very sudden drop off to a null. Then the signal will ramp back up, but to a lower signal level. The signal patches over a faulted cable are often six (6) feet in length along the path of the buried cable, with the fault located at the end of the patch just before the sharp drop off in signal as seen in FIG. 12 and FIG. 13. Sometimes, the fault will be indicated by a sudden sharp peak in signal strength; in this case, the fault is located at the center of the peak as seen in FIG. 14 and FIG. 15.

If the signal's level over the cable is too strong, and a sharp distinction between a faulted section of cable and a unfaulted section is too small, the user can ground one (1) or more conductors in the cable being inspected to suppress the signal coupling to the earth on the unfaulted sections of cable. Normally the user tries to ground an unfaulted conductor inside the faulted cable. If this is not possible, then the user could try to ground a conductor that is faulted past the first suspected fault.

The user will find that if the cable being inspected is in a common trench with other multi-conductor cables, and these cables also have faulted sections, the antenna/receiver or probe/receiver will also detect these faults. The RF signal will couple to the other cables in the common trench and causes existence of signal peaks and spreading signal nulls over faults of these cables as well as the faults in the cable the transmitter is connected to.

If the faults in those cables are not too close to the cable under test, grounding procedure of a conductor inside the tested cable will often suppress signal spikes existing over untested cables.

Another method to suppress faults in adjacent cables is provided by means of connecting a conductor under inspection to either the red or black transmitter's output wire and earth grounding the two together. In this case, the other transmitter's output wire is left unconnected. Then, while probing only the faulted conductor (which is grounded with the transmitter's output), the signal will be detected. However, the strength of this signal will be greatly reduced, but will still remain noticeable enough. If the user takes the unconnected transmitter's output and connects it to a piece of wire about four feet long (thus making an antenna), said wire hanging off a pole will boost the signal detected at the fault when using the probe. In case of use of the receiver with the antenna, it is possible, as usual, to trace the conductor, but the signal will disappear right after the fault.

It must be emphasized that in the situation when there are a lot of metal objects buried in the ground near the cable under testing, the system might not work, and signal patches on the surface will not show any peaks in view of the fact that those metal objects will conduct the signal energy away from the surface. The same situation applies to the spreading null effect when using the antenna. However, such accidental situation does not happen very often (not more then one (1) location out of hundreds has shown this problem).

Another area that can cause problems is trying to probe in tall wet grass. The electromagnetic signals are very strong on tall wet grass blades, and as a result, the user must usually beat down a path through the grass so that the metallic probe can make contact with the earth. This is generally not a problem if the grass is dry.

Concrete walkways and concrete walls can effect the signal detected causing a one sided null when using the antenna/receiver while tracing the signal path if the cable under test runs parallel to the concrete object. In this case, the cable is buried at the edge of the one sided peak. Probing the ground will still show up the faults as normally detected.

It is also possible to probe cables buried under concrete and asphalt. If the user wets the concrete first with water, then when the metallic probe is pressed against the wet concrete, the probe will work in the same manner as when probing earth. If wetting down the concrete is not possible then the user can attach a wide (2 inch) ground braid to the bottom of the metallic probe to increase the surface area of the metallic probe in contact with the concrete.

While the invention has been described with respect to a certain embodiment thereof; it is understood that the applicant does not desire to limit his invention to the exact details illustrated and described except in so far as those details may be defined in the claims.

What is claimed is:

1. Apparatus for detecting faults in buried multi-conductor cable comprising:

transmitter means adapted to transmit electro-magnetic signals down the buried cable, wherein said signals are provided to form an electro-magnetic path of said signals located at the surface above said buried cable having faults; wherein said faults are characterized by pressure of increased level of said electro-magnetic signals caused by leakage of said signals from said faults into a surrounding earth medium;

a detecting means adapted to detect the location of said buried multi-conductor cable having faults by means of identifying said electro-magnetic signals located over said cable and said faults as a predetermined configuration of nulls and peaks distributed over and indicating the position of said buried cable and said faults;

wherein said detecting means are capable to detect the exact location of said faults in said multi-conductor cable buried at variable depth.

2. Apparatus according to claim 1, wherein said transmitter means is adapted to transmit a composite signal comprising a carrier signal transmitted by a carrier signal means and a low frequency signal transmitted by a low frequency means.

3. Apparatus according to claim 2, wherein said carrier signal means comprising a RF carrier signal means and an audio tone signal means; wherein said audio tone signal means adapted to modulate signals transmitted by said RF carrier signal means.

4. Apparatus according to claim 2, wherein said low frequency signal means adapted to modulate signals transmitted by said carrier signal means, and wherein said low frequency signal is provided to increase the level of electro-magnetic energy present at faults of said buried cable.

5. Apparatus according to claim 2, wherein said carrier signal means is adapted to operate in a trace mode provided to locate the position of said buried cable under the ground, and wherein said trace mode is characterized by continuous signal transmitted by said carrier signal means.

6. Apparatus according to claim 5, wherein said transmitter means is adapted to operate in a fault mode provided to detect presence of faults in said cable, wherein in said fault mode said transmitter means is transmitting the composite signal.

7. Apparatus according to claim 5, wherein said low frequency signal means adapted to modulate signals transmitted by said carrier signal means.

8. Apparatus according to claim 6, wherein said transmitter means further comprising a switch means adapted to switch between said trace mode and said fault mode.

9. Apparatus according to claim 1, wherein said transmitter means further comprising an impedance matching network means adapted to connect said transmitter means to live lines without any disturbance that may be noticed by users of said lines and that are caused by the signals transmitted by said transmitter means while allowing to detect faults in said cable.

10. Apparatus according to claim 9, wherein said impedance matching network comprising a transmitter output power level control circuitry means.

11. Apparatus according to claim 2, wherein said detecting means comprising a fault sensing means connected to a receiver means.

12. Apparatus according to claim 11, wherein said fault sensing means comprising a probe means adapted to pierce the earth-air impedance boundary existing at the earth surface and to detect presence of said electro-magnetic path of signals identified by said probe means as the predetermined configuration of nulls and peaks distributed over and indicating the exact location of said cable and said faults.

13. Apparatus according to claim 12, wherein said probe means comprising a single metallic probe connected to a band pass filter circuit means, wherein said band pass filter circuit means are tuned exactly to a frequency transmitted by said carrier signal means, thus allowing to control the level of energy passing through said band pass filter circuit means.

14. Apparatus according to claim 11, wherein said receiver means further comprising a display means adapted to display the presence of said electro-magnetic path of signals located above said buried cable having faults and identified by said fault sensing means as the predetermined configuration of nulls and peaks distributed over and indicating the location of said cable and said faults.

15. Apparatus according to claim 12, and wherein said fault sensing means is adapted to operate in a null-peak-null mode provided to detect an abrupt increase of the electro-magnetic signal energy level existing above said faults; wherein the peak is located above said fault and nulls are located prior and after said fault.

16. Apparatus according to claim 14, wherein said display means comprising an audio means adapted to provide audio signals displaying presence of said electro-magnetic path of signals and identified by said fault sensing means as said configuration of peaks and nulls distributed over and indicating the location of said cable and said faults.

17. Apparatus according to claim 14, wherein said display means comprising a signal strength means.

18. Apparatus according to claim 17, wherein said signal strength means comprises a root mean square conversion circuit means adapted to transmit the audio signal received from a headset means into a voltage to be displayed on a volt meter.

19. Apparatus according to claim 11, wherein said fault sensing means comprising an antenna means adapted to detect the presence of said electro-magnetic path of signals located above said buried cable and said faults and identified by said antenna means as the predetermined configuration of peaks and nulls distributed over and indicating the location of said cable and said faults.

20. Apparatus according to claim 19, wherein said antenna means is adapted to operate in a peak-null-peak mode provided to detect a signal null in the air over said cable, and wherein the presence of said faults is characterized by abrupt spreading of peaks on each side of the signal null located above said faults.

21. Method for detecting faults in buried multi-conductor cables conductor comprising the steps of;

transmitting an electro-magnetic signals down the buried cable, wherein said signals are adapted to form an electro-magnetic path of said signals located at the surface above said buried cable having faults; wherein said faults are characterized by presence of increased level of said electro-magnetic signals caused by leakage of said signals from said faults into a surrounding earth medium;

detecting the location of said cable and said faults by means of identifying said electro-magnetic signals located over said cable and said faults as a predetermined configuration of nulls and peaks distributed over and indicating the position of said buried cable and said faults;

wherein said detecting means are capable to detect the exact location of said faults in said multi-conductor cable buried at variable depth.

22. Method according to claim 21, wherein said electromagnetic signal comprising a composite signal.

23. Method according to claim 21, wherein said composite signal comprises a carrier signal and a low frequency signal.

24. Method according to claim 23, wherein said carried signal comprises high frequency RF signal and audio tone signal modulating said RF signal, wherein said carrier signal is provided to detect location of said buried cable under the ground.

25. Method according to claim 22, wherein said composite signal is provided to detect location of faults of said cable.

26. Method according to claim 21, wherein detection of said faults is provided by a fault sensing means connected to a receiver means.

27. Method according to claim 26, wherein said fault sensing means comprises a probe means, and wherein detection of said faults is provided by means of piercing an earth-air impedance boundary existing at the earth surface to detect the electro-magnetic path of signals by said probe means and comparing the level of electro-magnetic signal energy of unfaulted sections of said cable and faulted sections of said cable, wherein signal energy level existing over said faulted sections is substantially greater then signal energy level existing over said unfaulted sections.

28. Method according to claim 27, wherein detection of said faults is provided by means of suppressing all signals transmitted by any other faulted cable buried in the close vicinity of said multi-conductor cable, wherein said suppression is provided by means of grounding at least one other conductors accommodated within said multi-conductor cable except the one being tested.

29. Method according to claim 27, wherein said fault sensing means are operating in a "null-peak-null" mode characterized by a sudden ramp up or increase in signal strength followed by a sudden sharp drop of said signal strength.

30. Method according to claim 28, wherein said fault sensing means are operating in a "null-peak-null" mode characterized by a sudden peak in signal strength above said fault after a low flat signal level was detected.

31. Method according to claim 26, wherein said fault sensing means comprising an antenna means, and wherein detection of said faults is provided by means of detecting the signal null over said buried cable, wherein faulted sections of said cable characterized by an abrupt spreading of the peaks on each side of the signal null detected by said antenna means, and wherein spreading of said peaks is directed perpendicularly to the cable's run.

32. Method according to claim 21, wherein said electro-magnetic signals are transmitted by a transmitter means provided with a ground return means.

33. Method according to claim 32, wherein the configurations of said nulls and peaks distributed over and indicating the location of said faults are controlled by means of the positioning of said ground return means relative to the location of said buried cable.

34. Method according to claim 33, wherein said ground return means is positioned on a distance away from said buried cable, and wherein said nulls and peaks forming an offset lobe configuration, wherein the configuration of said offset lobe allows detection of the exact location of the faults of said buried cable.

35. A detecting means for detecting faults in buried multi-conductor cables comprising:

a fault sensing means, said fault sensing means adapted to detect electro-magnetic path of signals located at the surface above said buried cable having faults, wherein said faults are characterized by presence of increased level of said electro-magnetic signals caused by leakage of said signals from said faults into a surrounding earth medium; said fault sensing means are adapted to detect the location of said buried cable and said faults by means of identifying said electro-magnetic signals as a predetermined configuration of nulls and peaks distributed over and indicating the exact position of said buried cable and said faults;

said fault sensing means being connected to a receiver means, wherein said receiver means are adapted to display the presence of said electro-magnetic path of signals identified by said fault sensing means as the predetermined configuration of nulls and peaks distributed over and indicating the location of said cable and said faults.

36. A detecting means according to claim 35, wherein said fault sensing means comprising a probe means, wherein said probe means adapted to pierce an earth-air impedance boundary existing at the earth surface to detect presence of said electro-magnetic path of signals located above said cable having faults and identified by said fault sensing means as the predetermined configuration of nulls and peaks distributed over and indicating the exact location of said buried cable and said faults.

37. A detecting means according to claim 36, wherein said probe means comprising a single metallic probe connected to a band pass filter circuit means, wherein said band pass filter circuit means are tuned exactly to a frequency transmitted by a transmitter means, thus allowing to control the level of energy passing through said band pass filter means.

38. Impedance matching network means comprising a transmitter output power level control circuitry means, said transmitter output power level control circuitry means being connected to a transmitter means, wherein said transmitter means provided to transmit a signal down live lines, wherein said transmitter output power level control circuitry means is adapted to connect said transmitter means to said live lines without any disturbance that may be noticed by a user of said live lines and that are caused by the signal transmitted by said transmitter means while allowing to test and to detect faults in said live lines.

39. Apparatus according to claim 11, wherein said fault sensing means comprising:

a probe means adapted to pierce the earth-air impedance boundary existing at the earth surface and to detect presence of said electro-magnetic path of signals identified by said probe means as the predetermined configuration of nulls and peaks distributed over and indicating the exact location of said cable and said faults;

wherein said probe means is adapted to operate in a null-peak-null mode provided to detect an abrupt increase of the electro-magnetic signal energy level existing above said faults, said peak is located above said fault and nulls are located prior and after said fault; and an antenna means adapted to detect the presence of said electro-magnetic path of signals located above said buried cable and said faults and identified by said antenna means as the predetermined configuration of peaks and nulls distributed over and indicating the location of said cable and said faults;

wherein said antenna means is adapted to operate in a peak-null-peak mode provided to detect a signal null in the air over said cable, and wherein the presence of said faults is characterized by abrupt spreading of peaks on each side of the signal null located above said faults;

wherein said antenna means are provided to detect the approximate location the area having faults and said probe means are provided to determine the exact location of the fault found by said antenna means in said area.

40. Method according to claim 26, wherein said fault sensing means comprises:

a probe means, and wherein detection of said faults is provided by means of piercing an earth-air impedance boundary existing at the earth surface to detect the electro-magnetic path of signals by said probe means and comparing the level of electro-magnetic signal energy of unfaulted sections of said cable and faulted sections of said cable, wherein signal energy level existing over said faulted sections is substantially greater then signal energy level existing over said unfaulted sections;

wherein said probe means are operating in a "null-peak-null" mode characterized by a sudden ramp up or increase in signal strength followed by a sudden sharp drop of said signal strength; and an antenna means, wherein detection of said faults is provided by means of detecting the signal null over said buried cable, wherein faulted sections of said cable characterized by an abrupt spreading of the peaks on each side of the signal null detected by said antenna means, said spreading of peaks is directed perpendicularly to the cable's run;

wherein said antenna means are used first to detect the approximate location of the faulted section of said cable and said probe means are used to identify the exact location of faults in said section.

* * * * *